US012603661B2

(12) United States Patent
Van Der Ven et al.

(10) Patent No.: US 12,603,661 B2
(45) Date of Patent: Apr. 14, 2026

(54) ANALOG-TO-DIGITAL CONVERTER, ADC, A METHOD FOR CONTROLLING SAID ADC, AND A METHOD FOR CONTROLLING A DIGITAL-ANALOG-CONVERTER FOR SAID ADC

(71) Applicant: Stichting IMEC Nederland, Eindhoven (NL)

(72) Inventors: Stan Van Der Ven, Oss (NL);
Yao-Hong Liu, Eindhoven (NL);
Yuming He, Eindhoven (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 72 days.

(21) Appl. No.: 18/527,683

(22) Filed: Dec. 4, 2023

(65) Prior Publication Data

US 2024/0204794 A1     Jun. 20, 2024

(30) Foreign Application Priority Data

Dec. 20, 2022     (EP) ..................................... 22214802

(51) Int. Cl.
*H03M 1/46*          (2006.01)
(52) U.S. Cl.
CPC ................................... *H03M 1/466* (2013.01)
(58) Field of Classification Search
CPC ...... H03M 1/466; H03M 1/002; H03M 1/468; H03M 1/1245
See application file for complete search history.

(56) References Cited

U.S. PATENT DOCUMENTS

| | | | | |
|---|---|---|---|---|
| 7,986,253 | B2 * | 7/2011 | Cho | H03M 1/0695 |
| | | | | 341/161 |
| 8,928,506 | B2 * | 1/2015 | Pullela | H03M 1/002 |
| | | | | 341/145 |
| 9,048,860 | B1 * | 6/2015 | Quinn | H03M 1/46 |
| 9,397,679 | B1 * | 7/2016 | Harpe | H03M 1/1033 |
| 9,432,037 | B2 * | 8/2016 | Oh | H03M 1/06 |
| 9,467,161 | B1 * | 10/2016 | Kim | H03M 1/145 |
| 9,479,190 | B2 * | 10/2016 | Luo | H03M 1/125 |
| 10,135,457 | B2 * | 11/2018 | Chang | H03M 1/466 |
| 10,211,847 | B1 * | 2/2019 | Chung | H03M 1/468 |
| 10,425,095 | B1 * | 9/2019 | Price | H03M 1/365 |
| 10,476,513 | B1 * | 11/2019 | Chang | H03M 1/06 |
| 10,511,320 | B2 * | 12/2019 | Chuang | H03M 1/468 |
| 10,693,487 | B1 * | 6/2020 | Lei | H03M 1/468 |
| 10,790,842 | B1 * | 9/2020 | Paussa | H03M 1/069 |
| 10,862,497 | B1 * | 12/2020 | Lin | H03M 1/1245 |
| 10,985,773 | B2 * | 4/2021 | Zhou | H03M 1/365 |
| 11,050,432 | B2 * | 6/2021 | Zhu | H03M 1/1245 |
| 11,239,853 | B1 * | 2/2022 | Dai | H03M 1/804 |
| 11,296,714 | B2 * | 4/2022 | Guo | H03M 3/382 |
| 11,521,051 | B2 * | 12/2022 | Chang | G06N 3/09 |
| 12,212,334 | B2 * | 1/2025 | Singh | H03M 1/468 |
| 12,316,339 | B2 * | 5/2025 | Prasad | H03M 1/466 |

| | | | | |
|---|---|---|---|---|
| 2011/0057823 | A1 * | 3/2011 | Harpe | H03M 1/125 |
| | | | | 341/155 |
| 2012/0306671 | A1 * | 12/2012 | Kapusta | H03M 1/1057 |
| | | | | 341/172 |
| 2013/0002467 | A1 * | 1/2013 | Wang | H03M 1/145 |
| | | | | 341/172 |
| 2013/0308028 | A1 * | 11/2013 | Bahukhandi | H03M 1/1023 |
| | | | | 341/172 |
| 2022/0337261 | A1 * | 10/2022 | Huang | H03M 1/1023 |
| 2024/0429933 | A1 * | 12/2024 | Huang | H03M 1/1245 |

OTHER PUBLICATIONS

Ding, et al., "Delta-Measurement Low-Power SAR ADC Architecture with Adaptive Threshold-First Switching", Institute of Integrated Circuits and Systems, University of electronic science and technology of China, Chengdu, China, 978-1-5386-4881-0/18 © 2018 IEEE, pp. 1-4.
Song, et al., "A 0.6-V 10-bit 200-kS/s Fully Differential SAR ADC With Incremental Converting Algorithm for Energy Efficient Applications", IEEE Transactions on Circuits and Systems—I:Regular Papers, vol. 63, No. 4, Apr. 2016, pp. 449-458.
Yaul, et al., "A 10 bit SAR ADV With Data-Dependent Energy Reduction Using LSB-First Successive Approximation", IEEE Journal of Solid-State Circuits, vol. 49, No. 12, Dec. 2014, pp. 2825-2834.
Lee, et al., "Input-tracking DAC for low-power high-linearity SAR ADC", Electronics Letters, Aug. 4, 2011, vol. 47, No. 16, pp. 1-2.
Sirimasakul, et al., "A logarithmic level-crossing ADC", 2017 14th International Conference on Electrical Engineering/Electronics, Computer, Telecommunications and Information Technology (ECTI-CON), downloaded on Aug. 31, 2022, pp. 576-579.
Ghasemi, et al., "An Ultra-Low Power Level-Crossing ADC for ECG Monitoring Application", 2020 28th Iranian Conference on Electrical Engineering (ICEE), downloaded on Jun. 27, 2022, pp. 1-6.

(Continued)

*Primary Examiner* — Lam T Mai
(74) *Attorney, Agent, or Firm* — MOSER TABOADA

(57)          ABSTRACT

An analog-to-digital converter, ADC, is provided. The ADC comprises a comparator having a first input and a second input. The ADC further comprises a first digital-to-analog converter, DAC, and a second DAC configured to receive a first and a second digital reference signal, respectively. The digital reference signals ($D_{ref}$) represent a signed binary value. The ADC is configured to compare input voltages ($V_{in}$), based on a first sampled input signal of a differential input signal and the first digital reference signal, and based on a second sampled input signal of the differential input signal and the second digital reference signal and, based on said comparison, adjust the reference voltage so as to approximate the differential input signal.

13 Claims, 2 Drawing Sheets

(56)     References Cited

OTHER PUBLICATIONS

Das, et al., "Activity Dependent Multichannel ADC Architecture using Level Crossing Quantisation for Atrial Electrogram Recording", Section Bioelectronics, TU Delft, Delft, the Netherlands, downloaded on Jun. 27, 2022, pp. 1-4.

Trakimas, et al., "An Adaptive Resolution Asynchronous ADC Architecture for Data Compression in Energy Constrained Sensing Applications", IEEE Transactions on Circuits and Systems—I: Regular Papers, vol. 58, No. 5, May 2011, pp. 921-934.

Ginsburg, et al., "An Energy-Efficient Charge Recycling Approach for a SAR Converter With Capacitive DAC",—Proceedings—IEEE International Symposium on Circuits and Systems, downloaded on Jun. 27, 2022, pp. 184-187.

Zhu, et al., "$V_{cm}$-based monotonic capacitor switching scheme for SAR ADC", Electronics Letters, Feb. 28, 2013, vol. 49, No. 5, pp. 1-2.

Liu, et al., "A 10-bit 50-MS/s SAR ADC With a Monotonic Capacitor Switching Procedure", IEEE Journal of Solid-State Circuits, vol. 45, No. 4, Apr. 2010, pp. 731-740.

Wang, et al., "A 10-bit SAR ADC using novel LSB-first successive approximation for reduced bitcycles", Microelectronics Journal 103 (2020) 104873, Jul. 25, 2019, pp. 1-8.

Khurana, et al., "Recode then LSB-first SAR ADC for Reducing Energy and Bit-cycles", Proceedings—IEEE International Symposium on Circuits and Systems, May 2018, downloaded on Jun. 27, 2022, pp. 1-5.

Waters, et al., "LSB—First SAR ADC with Bit-Repeating for Reduced Energy Consumption", 2014 21$^{st}$ IEEE International Conference on Electronics, Circuits and Systems, ICECS 2014, downloaded on Jun. 27, 2022, pp. 203-206.

Ravanshad, et al., "A Fully-Synchronous Offset-Insensitive Level-Crossing Analog-to-Digital Converter", 2016 IEEE 59$^{th}$ International Midwest Symposium on Circuits and Systems (MWSCAS), Oct. 16-19, Abu Dhabi, UAE, downloaded on Jun. 27, 2022, pp. 1-4.

Li, et al., "A Sub-Microwatt Asynchronous Level-Crossing ADC for Biomedical Applications", IEEE Transactions on Biomedical Circuits and Systems, vol. 7, No. 2, Apr. 2013, pp. 149-157.

Li, et al., "A 0.5V Signal-Specific Continuous-Time Level-Crossing ADV with Charge Sharing", 2011 IEEE Biomedical Circuits and Systems Conference, BioCAS 2011, downloaded on Jun. 27, 2022, pp. 381-384.

Extended European Search Report for Application No. EP-22214802.5 dated Jun. 21, 2023.

* cited by examiner

ANALOG-TO-DIGITAL CONVERTER, ADC, A METHOD FOR CONTROLLING SAID ADC, AND A METHOD FOR CONTROLLING A DIGITAL-ANALOG-CONVERTER FOR SAID ADC

CROSS-REFERENCE TO RELATED APPLICATIONS

The present application claims the benefit of and priority to EP Patent Application Serial No. 22214802.5, filed Dec. 20, 2022, the entire contents of which is incorporated herein by reference.

TECHNICAL FIELD

The present disclosure relates to the field of analog-to-digital converters, ADCs, and digital-to-analog-converters, DACs, used in ADCs.

The project leading to this application has received funding from the European Research Council (ERC) under the European Union's Horizon 2020 research and innovation programme (grant agreement No 101001448).

BACKGROUND

ADCs have been, and are currently, in use in almost every field of technology. As the size and power consumption of semiconductors has been steadily decreasing over the years while still providing potential computational power, the size and power consumption of electronic devices have correspondingly decreased. However, it has been observed that power consumption of ADCs has not been reduced to the same degree as the reduction of power consumption in semiconductors. As a consequence, a large portion of the power consumption of modern electronic devices comprising semiconductors and ADCs is attributed to the power consumption of ADCs. Such electronic devices may be configured as, for example, a sensor unit configured to continuously, or intermittently, measure a physical characteristic, i.e., analog data, convert said physical characteristic using an ADC to digital data, and store and/or transmit said digital data.

One type of ADC is the Flash-ADC, which is, as the name infers, a fast type ADC. However, the Flash-ADC is very expensive with regards to power consumption. A more power efficient type of ADC is successive-approximation, SAR, ADCs. For sparse signals, power efficiency can be improved even more by decreasing the number of comparisons by using signal-dependent ADCs, such as a level-crossing ADC.

A major portion of the power consumption of level-crossing ADCs is consumed by one or more comparisons of the ADC. In other words, a major portion of the power is consumed when comparing the input signal to a reference signal, in order to determine a value of the input signal.

Therefore, it is of interest to provide a more power efficient ADC and a method for controlling an ADC which provides a more efficient power usage.

SUMMARY

An objective of the present disclosure is to provide an improved ADC and an improved DAC having decreased power consumptions, and a method for controlling said ADC.

According to a first aspect of the present disclosure, an analog-to-digital converter, ADC, is provided. The ADC comprises a comparator having a first input and a second input, a first and a second digital-to-analog converter, DAC. The first DAC comprises a first capacitor bank having N number of first capacitors, wherein first plates of the first capacitors of the N number of first capacitors are controlled by bits of a first digital reference signal and wherein second plates of the first capacitors of the N number of first capacitors are configured to receive a sampled first input signal of a differential input signal. The second DAC comprises a second capacitor bank having N number of second capacitors, wherein first plates of the second capacitors of the N number of second capacitors are controlled by bits of a second digital reference signal and wherein second plates of the second capacitors of the N number of second capacitors are configured to receive a sampled second input signal of the differential input signal. The first and the second DAC are configured to supply first and second input voltages to the first and second inputs, respectively, of the comparator. The first and second digital reference signals represent a signed binary value. The ADC is configured to compare the first and the second input voltages. The ADC is further configured to, based on said comparison, adjust the first or second digital reference signal so as to approximate a difference between the first and the second input signals. The ADC may be configured to selectively change the first digital reference signal or the second digital reference signal in dependence of the comparison.

According to a second aspect of the present disclosure, a method for controlling an analog-to-digital converter, ADC, is provided. The method according to the second aspect comprises the steps of supplying a first digital reference signal to a first capacitor bank of a first digital-to-analog converter, DAC, of the ADC, wherein the first capacitor bank has N number of first capacitors and wherein first plates of the first capacitors of the N number of first capacitors are controlled by bits of a first digital reference signal, supplying a second digital reference signal to a second capacitor bank of a second DAC, wherein the second capacitor bank has N number of second capacitors and wherein first plates of the second capacitors of the N number of second capacitors are controlled by bits of a second digital reference signal, supplying a sampled first input signal of a differential input signal to second plates of the first capacitors, supplying a sampled second input signal of a differential input signal to second plates of the second capacitors, supplying first and second input voltages to first and second inputs, respectively, of a comparator of the ADC, wherein the first input voltage is based on the first digital reference signal and the sampled first input signal and wherein the second input voltage is based on the second digital reference signal and the sampled second input signal, comparing the first and second input voltages, and adjusting, based on a comparison of the first and second input voltages, the first or second digital reference signal so as to approximate a difference between the first and the second input signals. The first and second digital reference signal represent a signed binary value in that each of the first and second digital reference signal represent a magnitude of the signed binary value and a sign of the signed binary value controls which of the first or the second digital reference signal that is to be adjusted.

The present disclosure is based on the understanding that a vast amount of power, i.e., electrical energy or power, is consumed in a DAC when switching between different reference voltages provided to the DAC. Further, the present disclosure is based on the understanding that particular ADCs, such as an SAR ADC or a level-crossing ADC, utilize one or more capacitor banks, wherein the capacitors of a capacitor bank are configured to be charged based on a reference signal representing a binary signal. In such a capacitor bank, each capacitor is usually configured to correspond to a bit of the binary signal. Therefore, a capacitor which corresponds to a specific bit may have twice the capacitance of another capacitor which corresponds to a bit which is one step less significant than the specific bit. Consequently, the capacitor which corresponds to the most significant bit, MSB, may have the highest capacitance, and the capacitor which corresponds to the least significant bit, LSB, may have the lowest capacitance.

The capacitors in the capacitor bank may be provided with a voltage (high/low) on a first plate representing a value of a corresponding bit of the digital reference signal. When adjusting a reference voltage representing the digital reference signal, it must be ensured the capacitors which corresponds to a bit set to a logical one are charged, and the capacitors which corresponds to a bit set to a logical zero are depleted, so as to make sure that the adjusted reference voltage correctly corresponds, or represents, the binary signal. Further, it has been realized that ADCs often start with a reference voltage which is in the middle of possible values that can be represented. Such a middle value may be represented by binary number equal to a logical one, 1, followed by zeroes, 0's, or phrased differently, the MSB may be equal to 1 and the remaining bits may be equal to 0. However, when determining a value of the input signal, then the reference voltage may need to be decreased or increased in order to find a reference value that corresponds to the value of the input signal. A decrease of the reference voltage represented by the binary signal by the LSB of the binary signal, which equates to the MSB being equal to 0, and followed by all 1's, would cause all of the capacitors to have to change state, as the capacitor corresponding to the MSB, which has changed from 1 to 0, would be depleted and the remaining capacitors which were corresponding to bits equal to 0 would have to be charged as they would now be corresponding to bits equal to 1. Such charging and depletion of capacitors consumes a lot of power (i.e., electrical energy), especially for capacitors corresponding to the MSB and other more significant bits. The opposite situation, i.e., when the binary signal switches from all bits, except the MSB, being equal to 1 to all bits, except the MSB, being equal to 0, consequently also consumes a lot of power. Charging and/or depletion of a capacitor may, alternatively, be understood as switching of the capacitor. Further, charging the capacitor bank with the reference voltage corresponding to the digital reference signal at a first plate of the capacitors may be understood as pre-loading, and charging of the input signal onto a capacitor bank at a second plate of the capacitors may be understood as sampling.

Many sensors measure phenomena which follows a regular pattern, rhythm, or frequency, such as a sensor for measuring a bodily function. If such measurements are put through a filter, such as a high-pass filter, the underlying regular pattern, rhythm, or frequency, may be at least partially extracted, and only abnormal events may be passed, which may be what is important or of interest to track, identify, and/or measure. Such filtered signals, or other signals having similar characteristics may be referenced to as sparse signals. The value of a sparse signal would be mostly having values close to a middle value, or common-mode value. If represented digitally, a vast majority of the values of a sparse signal may be within a few LSBs from each other. Converting such a sparse signal using a reference signal provided to capacitors would frequently cause capacitors switching, similar to the examples discussed in above, when the sparse signal would deviate a few LSBs below or a few LSBs above the middle value (i.e., represented by a binary signal for which the is MSB is equal 1, and the remaining bits are equal to 0). Thus, pre-loading of a capacitor bank may consume a lot of power in order to convert a sparse signal, even though the sparse signal does not comprise much information of interest.

In light of the above understanding, it has been realized that it would be beneficial to reduce the amount of switching of capacitors of a DAC, and especially reducing the amount of switching of capacitors corresponding to more significant bits. Therefore, the present disclosure proposes the use of digital reference signal which represents a magnitude of a signed binary value. A signed binary value is a digital binary number for which the MSB defines the sign of the binary number, i.e., if the binary number is positive or negative. Correspondingly, the input signal may be represented as a signed signal, which may be performed at the measuring and/or at the sampling of the input signal. Therefore, when an input signal changes level, the amount of capacitors that may need to be switched is greatly reduced.

The comparator is configured to receive a first input voltage and a second input voltage from the first DAC and the second DAC, respectively. Each DAC receives a sampled input signal on second plates and a digital reference signal on first plates, such that the digital reference signal will be converted to an analog value through a size of a respective capacitor representing a particular bit of the digital reference signal. The input voltage is then a sum of the sampled input signal and the reference signal.

Adjusting the first or second digital reference signal so as to approximate a difference between the first and second input signals may be used for converting the differential input signal to a digital value. The first and second digital reference signal may represent the signed binary value which forms a digital representation of the difference between the sampled first input signal and the sampled second input signal.

It should be realized that first plates of each capacitor of the capacitor banks may be controlled by a respective bit of the digital reference signal. However, in some embodiments, the capacitor bank may for most significant bits comprise two capacitors such that not all bits correspond to a single capacitor in the capacitor bank. This may be utilized such that the ADC may be configured to change both the first digital reference signal and the second digital reference signal when most significant bits are to be changed such that a common mode between the input voltages input to the comparator is not changed when most significant bits are changed.

The signed binary value may have N+1 number of bits. Thus, the signed binary value may have one more bit than the capacitor bank has capacitors configured to generate a reference voltage based on the digital reference signal. The ADC may be further configured to selectively change the first digital reference signal or the second digital reference signal in dependence of which of the first input voltage and the second input voltage is larger. This may be understood as monotonic switching. Further, by selecting which of the first digital reference signal and the second digital reference signal is to be changed, the selection represents the most significant bit, MSB, of the signed binary value. The first digital reference signal and the second digital reference signal form a magnitude of the signed binary value. This implies that, thanks to the selective change of the first digital reference signal or the second digital reference signal, one less capacitor may be used than the number of bits to be represented.

The capacitor that may be omitted may be the one that would have been corresponding to the MSB, which may have the highest capacitance. Therefore, if a sparse signal would change between from a value a few LSBs below a middle value to a few LSBs above a middle value, then only capacitors corresponding to a few LSBs of the signed binary value would have to be switched, as the MSB of the signed binary value would instead be represented by which of the first or the second digital reference signal that is changed.

Each capacitor of the N number of capacitors may be controlled by a corresponding bit of the digital reference signal.

A first capacitor of each of the first and second capacitor banks may be controlled based on a least significant bit, LSB, of the first and second digital reference signal, respectively, and a subsequent capacitor may be controlled based on a bit of the first and second digital reference signal, respectively, which is subsequent to the bit for which control of a capacitor which is directly prior to said subsequent capacitor is based on. A subsequent capacitor may have a capacitance twice that of a capacitor which is directly prior to said subsequent capacitor. Therefore, avoiding switching of a capacitors which are controlled based on more significant bits saves more power than avoiding switching of capacitors which are controlled based on less significant bits. Thereby, by controlling capacitors based on signed binary values, the amount of switching of capacitors controlled based on more significant bits may be reduced, especially for sparse signals.

It should be realized that the capacitors need not necessarily have different sizes. For instance, as an alternative, the capacitors may each have an equal size and the digital reference signal may be represented by a thermometer code.

Adjusting the first digital reference signal or the second digital reference signal so as to approximate the difference between the first and second input signals may comprise increasing the signed binary value by one least significant bit, LSB, and adjusting the first digital reference signal or the second digital reference signal based on the increased signed binary value. In a next step, the adjusting may adjust a second least significant bit and so on until the comparator identifies a shift in which of the first or the second input voltages is larger. After this, a normal SAR search starting from a last checked bit towards the LSB may be performed in order to find the binary representation of the differential input signal.

Such an approach may be understood as an LSB-first approach. An LSB-first approach may be more power efficient, especially for an ADC converting a sparse signal.

Adjusting the first digital reference signal or the second digital reference signal so as to approximate the difference between the first and second signals may utilize first digital reference signal and second digital reference signal of a previously sampled value. Thus, the first digital reference signal and the second digital reference signal may be set based on the previously sampled value. When a subsequent sampled value is to be converted, the differential input signal may be compared to at least one of an upper threshold or a lower threshold. The upper threshold and the lower threshold may correspond to changing the least significant bit of the first digital reference signal or the second digital reference signal, respectively.

Such an approach may be understood as a level-crossing ADC. A level-crossing ADC may be more power efficient, especially for an ADC converting a sparse signal.

The ADC may further comprise circuitry configured to calculate the signed binary value. The circuitry may be understood as logic circuitry. The logic circuitry may be configured to output digital signals based on, at least, the comparisons of comparator. The digital signals may be used to digitally recreate (an approximation of) the analog input signal. The logic circuit may further be configured to deliver the digital reference signals and/or the signed binary value to the DACs of the ADC.

The ADC and other circuitry connected to the ADC may be configured to operate using sign-magnitude representation of values. This implies that no conversion between signed binary values and unsigned binary values is needed.

The ADC may further comprise a sample-and-hold circuit configured to provide the input signal to the DAC. The sample-and-hold circuit may be configured to receive output from a sensor and may be configured to sample-and-hold the output, wherein the held output may be understood as the input signal. The sample-and-hold circuit may be configured to receive a filtered output or may be configured to filter an output signal before sampling and holding said filtered output signal.

The present disclosure relates to all possible combinations of features recited in the claims. Objects and features described according to the first aspect may be combinable with, or replaced by, objects and features described according to the second aspect, the third aspect, and/or the fourth aspect, and vice versa.

Further objects and advantages of the various examples of the present disclosure will be described below by means of exemplifying embodiments.

BRIEF DESCRIPTION OF THE DRAWINGS

The above, as well as additional objects, features, and advantages of the present disclosure, will be better understood through the following illustrative and non-limiting detailed description, with reference to the appended drawings. In the drawings like reference numerals will be used for like elements unless stated otherwise.

Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Figure 1:
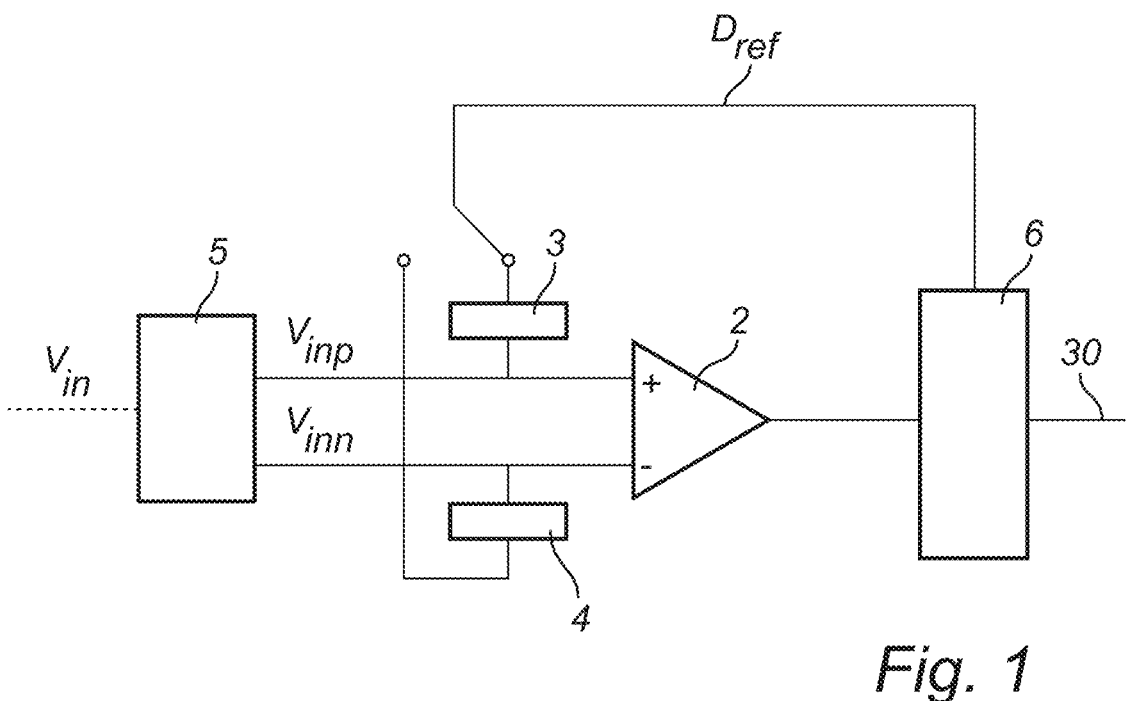
FIG. 1 is a schematic view of an ADC according to an exemplary embodiment of the present disclosure.

FIG. 1 illustrates an ADC 1 according to an exemplary embodiment of the present disclosure. The ADC 1 comprises a comparator 2 having a first input and a second input. The first input is illustrated in FIG. 1 as a plus symbol, "+", and the second input is illustrated in FIG. 1 as a minus symbol, "–". However, the illustration is purely exemplary, and the first input and the second input may be switched.

The ADC 1 may comprise a sample-and-hold circuit 5, which may be configured to supply a sampled and held differential input signal. The sampled and held differential input signal provides a first input signal $V_{inp}$ and a second input signal $V_{inn}$. The first input signal $V_{inp}$ may be provided with a first reference voltage to the first input to the comparator 2 and the second input signal $V_{inn}$ may be provided with a second reference voltage to the second input of the comparator 2.

It should be realized that an input signal Vin provided to the sample-and-hold circuit 5 need not be a differential signal but may alternatively be a single-ended signal. The sample-and-hold circuit 5 may still be configured to generate a differential input signal to the ADC 1. For instance, the first input signal $V_{inp}$ may correspond to a single-ended input signal $V_{in}$, whereas the second input signal $V_{inn}$ may be 0, whereby the ADC 1 configured to convert the differential input signal $V_{inp}-V_{inn}$ to a digital format will provide a conversion of $V_{in}$ to digital format as $V_{in}=V_{inp}-V_{inn}$.

The ADC 1 further comprises a first digital-to-analog converter, DAC, 3 configured to supply the first reference voltage to the first input of the comparator 2 and a second DAC 4 configured to supply the second reference voltage to the second input of the comparator 2.

The ADC 1 is configured to compare the first input voltage and the second input voltage using the comparator 2, and, based on said comparison, adjust the first or second reference voltage so as to approximate the difference between the first and second input signals $V_{inp}$ and $V_{inn}$. The ADC 1 may be configured adjust the first or the second reference voltage multiple times until a sufficient approximation has been acquired.

Each of the first and second reference voltages is based on a digital reference signal $D_{ref}$, wherein the digital reference signal $D_{ref}$ represents a signed binary value. The digital reference signal $D_{ref}$ may be determined by a logic circuit 6 of the ADC 1. A most significant bit of the digital reference signal $D_{ref}$ may control which of the first and second reference voltages that is to be adjusted so as to determine whether a first or a second digital reference signal provided to the first DAC 3 and the second DAC 4, respectively, is to be changed. Each of the first DAC 3 and the second DAC 4 may be configured to convert the first and a second digital reference signal, respectively, to the first and second reference voltages.

The logic circuit 6 may be configured to adjust or update the digital reference signal $D_{ref}$ based on comparison of the comparator 2. Further, the logic circuit 6 may be configured to output one or more signals 30, from which (approximation of) a digital version of the input signal $V_{in}$ may be recreated.

The first and second reference voltages are supplied via capacitor banks (not shown; see FIG. 2) of the first and second DACs 3, 4, each having N number of capacitors. Each capacitor of the N number of capacitors is controlled by a corresponding bit of a magnitude of the signed binary value represented by the digital reference signal $D_{ref}$.

The logic circuit 6 may be configured to determine the signed binary value based on, at least, comparisons of the comparator 2. The signed binary value may have N+1 number of bits. In other words, the signed binary value may have one more bit than the number of capacitors configured to supply the respective reference voltages. Further, ADC 1 may be configured to determine for which of the first and second DAC 3, 4, the reference voltage reference should be changed, based on a most significant bit, MSB, of the digital reference signal $D_{ref}$ which represents the signed binary value.

For instance, the first DAC 3 and the second DAC 4 may be set to provide a first reference voltage and a second reference voltage which is each equal to zero. This implies that the comparator 2 may be configured to compare $V_{inp}>V_{inn}$. If $V_{inp}$ is smaller than $V_{inn}$, the first digital reference signal may be increased by 1, i.e., a LSB is increased, corresponding to $\frac{1}{64}*V_{ref}$ if the signed binary value is represented by 7 bits. This implies that the comparator 2 will be configured to compare $V_{inp}+\frac{1}{64}*V_{ref}>V_{inn}$ in a subsequent comparison. If on the other hand, $V_{inp}$ is larger than $V_{inn}$, the second digital reference signal may be increased by 1 and the comparator 2 will be configured to compare $V_{inp}>V_{inn}+\frac{1}{64}*V_{ref}$.

Figure 2:
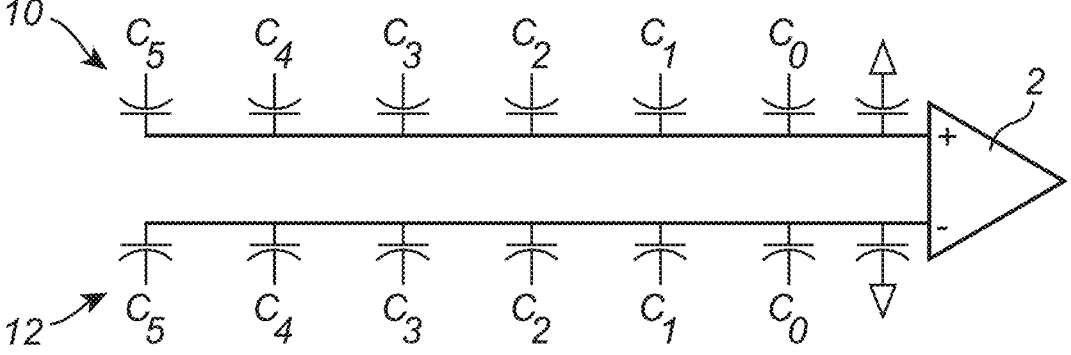
FIG. 2 is a schematic view of a capacitor bank and a comparator according to an exemplary embodiment of the present disclosure.

FIG. 2 is a schematic view of a first capacitor bank 10 and a second capacitor bank 12, each comprising a plurality of capacitors $C_0$-$C_5$ and a comparator 2 according to an exemplary embodiment of the present disclosure.

The capacitor banks 10, 12 shown in FIG. 2 may be understood as being part of a DAC of an ADC (not shown; see FIG. 1) according to the present disclosure. However, it is to be understood that the shown capacitor banks 10, 12 and the comparator 2 are simplified exemplary embodiments shown to provide an increased level of understanding of the present disclosure, and that the present disclosure is not limited to such a capacitor bank and a comparator 2.

Each capacitor bank 10, 12 comprises six capacitors $C_0$-$C_5$ which are configured to supply a reference voltage. The capacitor banks 10, 12 further comprises non-labeled dummy capacitor, which represent parasitic capacitances.

The six capacitors $C_0$-$C_5$ of the first and second capacitor banks 10, 12 may each be controlled based on a respective bit of a digital reference signal. A first capacitor $C_0$ may be configured to be controlled based on an LSB, i.e., the bit representing $2^0$. Consequently, a second capacitor $C_1$ may be controlled based on a second-LSB, i.e., the bit representing $2^1$, and so on. By being controlled based on a bit it may be understood that the bit determines if a first plate of a capacitor $C_0$-$C_5$ will be charged or depleted by a reference signal. Thereby, the bits of digital reference signal may determine the sum of the potential charge stored in the capacitors, which, when discharged forms the reference voltage.

Further, the difference in capacitance between two capacitors of the six capacitors $C_0$-$C_5$ may be equal to the difference in value which the two bits which controls said two capacitors. Thus, the third capacitor $C_2$ may have twice the capacitance of the second capacitor $C_1$, which may in turn have twice the capacitance of the first capacitor $C_0$. This ensures that level of the reference voltage corresponds to the value of the digital reference signal.

The capacitors $C_0$-$C_5$ of the first capacitor bank 10 are shown to be connected to the first input of the comparator 2 with the first digital reference signal provided to first plates of the capacitors $C_0$-$C_5$. It may be understood that a first sampled input signal (not shown; see FIG. 1) may be provided to second plates of the capacitors $C_0$-$C_5$ and further connected to the first input of the comparator 2 which thus receives the first sampled input signal and the first reference voltage based on the first digital reference signal as input.

The capacitors $C_0$-$C_5$ of the second capacitor bank 12 are shown to be connected to the second input of the comparator 2 with the second digital reference signal provided to first plates of the capacitors $C_0$-$C_5$. It may be understood that a second sampled input signal (not shown; see FIG. 1) may be provided to second plates of the capacitors $C_0$-$C_5$ and further connected to the second input of the comparator 2 which thus receives the second sampled input signal and the second reference voltage based on the second digital reference signal as input.

Figure 3:
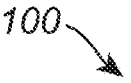
FIG. 3 is a flow chart comprising steps of a method according to an exemplary embodiment according to an aspect of the present disclosure.
Figure 3:
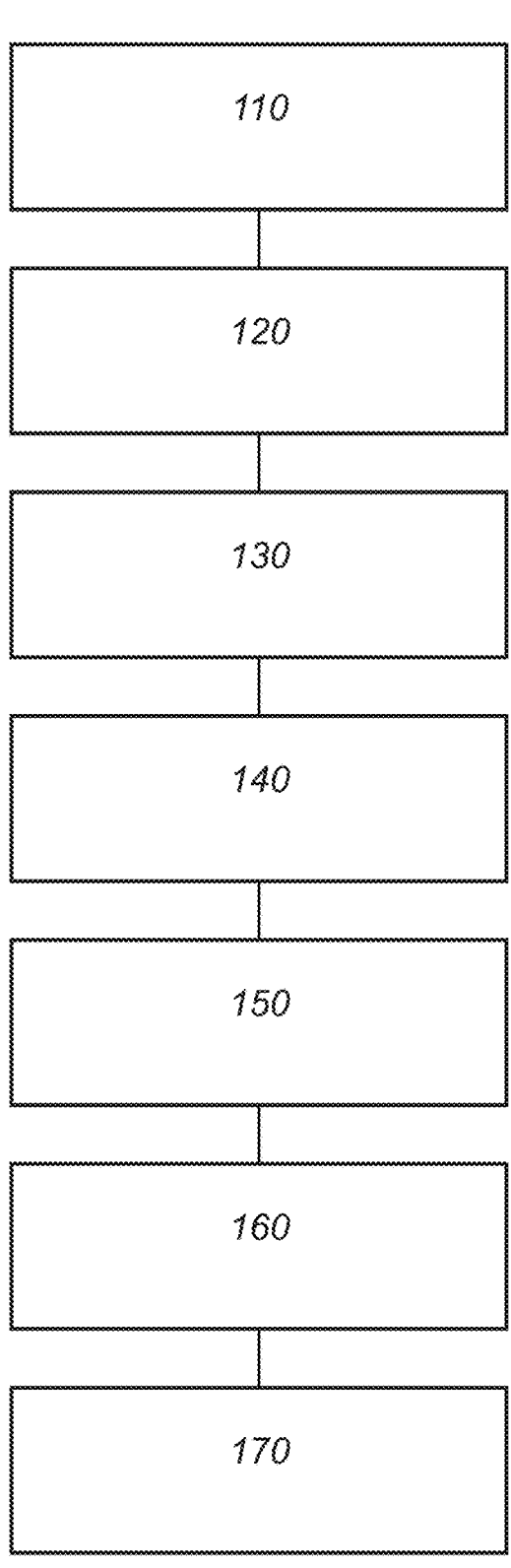

FIG. 3 is a flow chart comprising steps of a method 100 according to an exemplary embodiment according to an aspect of the present disclosure.

A method 100 for controlling an analog-to-digital converter, ADC, (not shown; see FIG. 1) is shown. The method 100 may comprise the step of supplying a predetermined first digital reference signal to a first capacitor bank of a first a digital-to-analog converter, DAC, of the ADC, wherein the first capacitor bank has N number of first capacitors and wherein first plates of the first capacitors of the N number of first capacitors are controlled by bits of the first digital reference signal. The method further comprises the step of supplying a predetermined second digital reference signal to a second capacitor bank of a second DAC, wherein the second capacitor bank has N number of second capacitors and wherein first plates of the second capacitors of the N number of second capacitors are controlled by bits of a second digital reference signal. The method further comprises the steps of supplying 110 a sampled first input signal of a differential input signal to second plates of the first capacitors and supplying 120 a sampled second input signal of a differential input signal to second plates of the second capacitors.

After the differential input signal is sampled, a previous signal is subtracted by the step 130 of supplying the first digital reference signal to the first capacitor bank of the first DAC based on the previous signal and the step 140 of supplying the second digital reference signal to the second capacitor bank of the second DAC.

The method further comprises the steps of supplying 150 first and second input voltage to first and second inputs of a comparator of the ADC, comparing 160 the first and second input voltages, and adjusting 170, based on a comparison of the first and second input voltages, the first or second digital reference signal so as to approximate a difference between the first and second input signals. The steps of comparing 160 and adjusting 170 may be performed multiple times until the difference between the first and second digital reference signals has sufficiently approximated the difference between the first and second input signals. The digital reference signals represent a signed binary value.

The adjusting of the first or second digital reference signal may comprise selectively changing the first digital reference signal or the second digital reference signal in dependence of which of the first input voltage and the second input voltage is larger.

In the above the inventive concept has mainly been described with reference to a limited number of examples. However, as is readily appreciated by a person skilled in the art, other examples than the ones disclosed above are equally possible within the scope of the present disclosure.

The invention claimed is:

1. An analog-to-digital converter, ADC, comprising:
a comparator having a first input and a second input;
a first digital-to-analog converter, DAC, comprising a first capacitor bank having N number of first capacitors, wherein first plates of the first capacitors of the N number of first capacitors are controlled by bits of a first digital reference signal and wherein second plates of the first capacitors of the N number of first capacitors are configured to receive a sampled first input signal of a differential input signal, wherein the first digital reference signal represents a signed binary value, and wherein the first DAC is configured to supply a first input voltage to the first input of the comparator,
wherein the first digital reference signal has N+1 number of bits, wherein a most significant bit of the N+1 number of bits is a sign bit, and remaining N bits of the N+1 number of bits are configured to respectively control the N number of first capacitors; and
a second DAC, comprising a second capacitor bank having N number of second capacitors, wherein first plates of the second capacitors of the N number of first capacitors are controlled by bits of a second digital reference signal and wherein second plates of the second capacitors of the N number of second capacitors are configured to receive a sampled second input signal of the differential input signal, wherein the second digital reference signal represents a signed binary value, and wherein the second DAC is configured to supply a second input voltage to the second input of the comparator,
wherein the second digital reference signal has N+1 number of bits, wherein a most significant bit of the N+1 number of bits is a sign bit, and remaining N bits of the N+1 number of bits are configured to respectively control the N number of second capacitors,
wherein the ADC is configured to compare the first and second input voltages and, based on said comparison, adjust the first digital reference signal or the second digital reference signal so as to approximate a difference between the first and second input signals, and
wherein the ADC is configured to selectively change the first digital reference signal or the second digital reference signal in dependence of said comparison.

2. The ADC according to claim 1, wherein the signed binary value has N+1 number of bits,
wherein the ADC is further configured to selectively change the first digital reference signal or the second digital reference signal in dependence of which of the first input voltage and the second input voltage is larger.

3. The ADC according to claim 1, wherein a first capacitor of each of the first and second capacitor banks is controlled based on a least significant bit, LSB, of the first and second digital reference signal, respectively, and
a subsequent capacitor is controlled based on a bit of the first and second digital reference signal, respectively, which is subsequent to the bit for which control of a capacitor which is directly prior to said subsequent capacitor is based on.

4. The ADC according to claim 3, wherein a subsequent capacitor has a capacitance twice that of a capacitor which is directly prior to said subsequent capacitor.

5. The ADC according to claim 1, wherein the ADC (being configured to adjust the first digital reference signal or the second digital reference signal so as to approximate the difference between the first and second input signals comprises: increasing the signed binary value by one least significant bit, LSB, and adjusting the first digital reference signal or the second digital reference signal based on the increased signed binary value.

6. The ADC according to claim 1, wherein the ADC being configured to set the first digital reference signal and the second digital reference signal based on the differential input signal sampled during a first sampling period and compare the differential input signal sampled during a second sampling period to at least one of an upper threshold or a lower threshold for determining whether a level-crossing occurred.

7. The ADC according to claim 1, further comprising circuitry configured to calculate the signed binary value.

8. The ADC according to claim 1, further comprising a sample-and-hold, S&H, circuit configured to provide the input signal to the DAC.

9. A method for controlling an analog-to-digital converter, ADC, comprising the steps of:

supplying a first digital reference signal to a first capacitor bank of a first digital-to-analog converter, DAC, of the ADC, wherein the first digital reference signal has N+1 number of bits, wherein a most significant bit of the N+1 number of bits is a sign bit, wherein the first capacitor bank has N number of first capacitors and wherein first plates of the first capacitors of N number of first capacitors are controlled by remaining N bits of the N+1 number of bits of the first digital reference signal;

supplying a second digital reference signal to a second capacitor bank of a second DAC, wherein the second digital reference signal has N+1 number of bits, wherein a most significant bit of the N+1 number of bits is a sign bit, wherein the second capacitor bank has N number of second capacitors and wherein first plates of the second capacitors of the N number of second capacitors are controlled by remaining N bits of the N+1 number of bits of the second digital reference signal;

supplying a sampled first input signal of a differential input signal to second plates of the first capacitors;

supplying a sampled second input signal of a differential input signal to second plates of the second capacitors;

supplying first and second input voltages to first and second inputs, respectively, of a comparator of the ADC, wherein the first input voltage is based on the first digital reference signal and the sampled first input signal and wherein the second input voltage is based on the second digital reference signal and the sampled second input signal;

comparing the first and second input voltages; and adjusting, based on a comparison of the first and second input voltages, the first or second digital reference signal so as to approximate a difference between the first and second input signals, wherein the first and second digital reference signals represent a signed binary value.

10. The method according to claim 9, wherein the signed binary value has N+1 number of bits; and wherein the method further comprises to selectively change the first digital reference signal or the second digital reference signal in dependence of which of the first input voltage and the second input voltage is larger.

11. The method according to claim 9, wherein a first capacitor of each of the first and second capacitor banks is controlled based on a least significant bit, LSB, of the first and second digital reference signal, respectively, and a subsequent capacitor is controlled based on a bit of the first and second digital reference signal, respectively, which is subsequent to the bit for which control of a capacitor which is directly prior to said subsequent capacitor is based on; and wherein a subsequent capacitor has a capacitance twice that of a capacitor which is directly prior to said subsequent capacitor.

12. The method according to claim 9, wherein the step of adjusting the first digital reference signal or the second digital reference signal comprises increasing the signed binary value by one least significant bit, LSB, and adjusting the first digital reference signal or the second digital reference signal based on the increased signed binary value.

13. The method according to claim 9, wherein the step of adjusting the first digital reference signal or the second digital reference signal so as to approximate the difference between the first and second signals utilizes first digital reference signal and second digital reference signal of a previously sampled value, and for a subsequent sample of the differential input signal, the differential input signal may be compared to at least one of an upper threshold or a lower threshold.

* * * * *